United States Patent [19]

Takemae

[11] Patent Number: 4,773,049
[45] Date of Patent: Sep. 20, 1988

[54] SEMICONDUCTOR MEMORY DEVICE HAVING IMPROVED ACCESS TIME FOR CONTINUOUSLY ACCESSING DATA

[75] Inventor: Yoshihiro Takemae, Tokyo, Japan

[73] Assignee: Fujitsu Limited, Kawasaki, Japan

[21] Appl. No.: 775,018

[22] Filed: Sep. 11, 1985

[30] Foreign Application Priority Data

Sep. 11, 1984 [JP] Japan ................................ 59-188891

[51] Int. Cl.$^4$ ........................... G11C 8/00; G11C 7/00
[52] U.S. Cl. ..................................... 365/239; 365/230; 365/233; 365/189
[58] Field of Search ............... 365/239, 240, 236, 233, 365/230, 189; 340/800, 802, 799

[56] References Cited
U.S. PATENT DOCUMENTS

4,422,160 12/1983 Watanabe ............................. 365/233
4,575,825 3/1986 Ozaki et al. ......................... 365/189
4,586,167 4/1986 Fujishima et al. .................. 365/230
4,618,947 10/1986 Tran et al. .......................... 365/189

Primary Examiner—Stuart N. Hecker
Assistant Examiner—Alfonso Garcia
Attorney, Agent, or Firm—Staas & Halsey

[57] ABSTRACT

The semiconductor memory device can continously read or store a plurality of data therefrom or therein. The semiconductor memory device includes a memory unit having a plurality of memory cells. The memory cells are arranged in a matrix having rows and columns. A reading/storing circuit is also provided. The reading/storing circuit can read data from or store data in the memory cell at an address corresponding to an address signal received therein in response to the first and second control signals, respectively. The reading/storing circuit also can consecutively read data from or store data in the memory cell at another address subsequent to a previous address read or stored, in response to the second control signal.

10 Claims, 7 Drawing Sheets

SEMICONDUCTOR MEMORY DEVICE HAVING IMPROVED ACCESS TIME FOR CONTINUOUSLY ACCESSING DATA

BACKGROUND OF THE INVENTION (1) Field of the Invention

The present invention relates to a semiconductor memory device. More particularly, it relates to a semiconductor memory device to be connected to a computer, such as a microprocessor, for continuously reading or storing a plurality of data therefrom or therein in response to a start address signal and a control signal.

(2) Description of the Related Art

In a prior art computer system including a computer and a semiconductor memory device, in response to an access request from the computer to the memory device, data storage or data reading is effected sequentially.

This system has a disadvantage in that a redundant operation must be carried out for continuously accessing a plurality of data, as described later in detail with reference to a specific example. As a result, the prior art semiconductor memory device cannot attain a high speed access time for continuously accessing a plurality of data.

SUMMARY OF THE INVENTION

It is an object of the present invention to provide a semiconductor memory device having improved access time for continuously accessing a plurality of data.

According to the present invention, there is provided a semiconductor memory device including a memory unit having a plurality of memory cells. The memory cells are arranged in a matrix having rows and columns. A circuit for reading or storing data from or into the memory cell at an address corresponding to row and column address signals received therein in response to reception of first and second control signals respectively, is provided. The circuit also consecutively reads or stores data from or into the memory cell at another address subsequent to the address read or stored at the last time in response to the second control signal.

According to the present invention, there is also provided a semiconductor memory device including a memory unit having a plurality of memory cells. The memory cells are arranged in a matrix having rows and columns. A circuit is provided for receiving a word address in response to a row-address-strobe signal, and a for receiving column address in response to a column-address-strobe signal. The circuit then reads data from or stores data in. The memory cell at an address defined by the received word address and column address, and consecutively reads data from or stores data in the memory cell at another address subsequent to the address read or stored at the last time, in response to consecutive receipt of the column-address-strobe signal.

According to the present invention, there is further provided a semiconductor memory device including a memory cell array having a plurality of cell blocks, each cell block having a plurality of memory cells. The memory cells arranged in a matrix having rows and columns. A plurality of word decoding circuits are provided, each word decoding circuit being connected to the corresponding cell block in the memory cell array. One word decoding circuit selects a word line in the corresponding cell block in response to a received word address. Each of the word decoding circuits, subsequent to the above one word decoding circuit selects a word line in the corresponding cell block which is increased by a predetermined number from the word line selected by the one word decoding circuit.

In addition, according to the present invention, there is provided a semiconductor memory device including a memory cell array having a plurality of cell blocks, each cell block having a plurality of memory cells. The memory cells arranged in a matrix having rows and columns. A plurality of data busses and a plurality of column decoding units are provided. The column decoding units are connected to corresponding cell blocks, and each column decoding unit having a plurality of column decoders for connecting a bit line in the cell block, corresponding to a received column address to one of the data busses, and consecutively connecting bit lines subsequent to the first bit line to the data busses subsequent to the above one of the data busses. A plurality of additional column decoding units are connected to the next corresponding cell blocks. Each additional column decoding unit has a plurality of column decoders which correspond to the plurality of column decoders arranged at one end of the column decoding unit connected to the adjacent cell block. The column decoder(s) in the additional column decoding unit are able to consecutively connect bit line(s) at another end of the next cell block to the remaining data bus(ses) when the corresponding column decoder(s) in the column decoding unit become operable.

Furthermore, according to the present invention, there is provided a semiconductor memory device including a memory cell array having a plurality of cell blocks, each cell block having a plurality of memory cells. The memory cells arranged in a matrix having rows and columns. A plurality of word decoding circuits are provided in which each word decoding circuit connected to a corresponding cell block in the memory cell array. One word decoding circuit selects a word line in the corresponding cell, block in response to a received word address. Each of the word decoding circuits subsequent to the one word decoding circuit selects a word line in the corresponding cell block which is increased by a predetermined number from the word line selected by the one word decoding circuit. A plurality of data busses and a plurality of column decoding units are also provided. The column decoding units are connected to the corresponding cell blocks. Each column decoding unit has a plurality of column decoders for connecting a bit line in the cell block corresponding to a received column address to one of the data busses, and consecutively connecting bit lines, subsequent to the first bit line, to the data busses subsequent to the above one of the data busses. A plurality of additional column decoding units are connected to next corresponding cell blocks. Each additional column decoding unit has plurality of column decoders which correspond to the plurality of column decoders arranged at one end of the column decoding unit connected to an adjacent cell block. The column decoder(s) in the additional column decoding unit are able to consecutively connect bit line(s) at another end of the next cell block to the remaining data bus(ses) when the corresponding column decoder(s) in the column decoding unit become operable.

According to the present invention, there is also provided a semiconductor memory device including a memory unit having a plurality of memory cells. The memory cells are being arranged in a matrix having rows and columns. A circuit is provided for receiving an address in response to a chip enable signal, for reading data into or storing data from the memory cell at an address defined by the received address signal, and for consecutively reading or storing data from or into the memory cell at another address subsequent to the address read or stored at the last time, in response to consecutive receipt of an output enable signal.

BRIEF DESCRIPTION OF THE DRAWINGS

Other objectives and features of the present invention will be described below in detail with reference to the accompanying drawings, in which:

FIG. 6, which includes 6a and 6b, is a detailed circuit diagram of the semiconductor memory device shown in FIG. 4;

DESCRIPTION OF THE PREFERRED EMBODIMENTS

Before describing preferred embodiments of the present invention, an explanation will be given of the prior art for reference.

Figure 1:
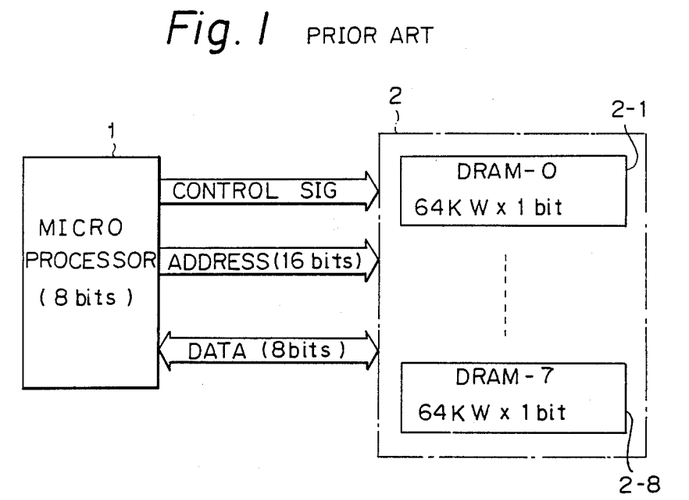
FIG. 1 is a block diagram of a conventional computer system including a conventional semiconductor memory device.

FIG. 1 is a block diagram of a conventional computer system. The computer system includes a microprocessor 1 and a random access memory (RAM) 2. The microprocessor 1 is an 8 bit type. The RAM 2 consists of eight dynamic-random access memory device chips (D-RAMs) 2-1 to 2-8, each having a 64 K words×1 bit memory capacity.

Figure 2:
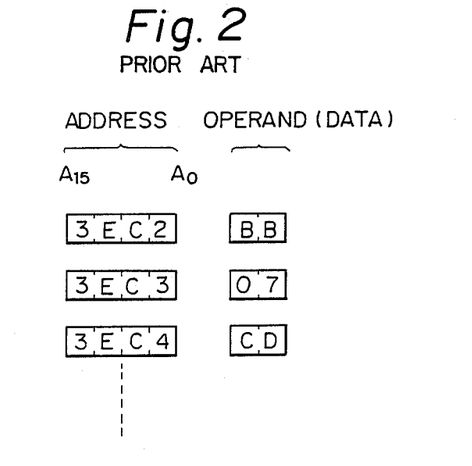
FIG. 2 is a chart of the addresses and operands stored in the addresses of the computer system in FIG. 1.

FIG. 2 is a chart of the addresses in the RAM 2 of FIG. 1, and operands stored in the corresponding addresses. In FIG. 2, each address is defined by four digits, each being hexadecimal format. Therefore, each address is formed by 16 bits: $A_0$ to $A_{15}$. Note, in general, each digit may contain numerals 0 to 15, however, in this description, numerals 10 to 15 are represented by "A", "B", "C", "D", "E" and "F", for convenient representation as one digit. Each operand has a two digit hexadecimal format and is formed by 8-bits. However, a complete operand necessary for execution consists of a plurality of operands, such as a combination of three operands "BB", "07", and "CD" as shown in FIG. 2. Accordingly, before executing an instruction, the microprocessor 1 must read a plurality of operands forming a complete operand to be executed from the RAM 2.

Figure 3A:
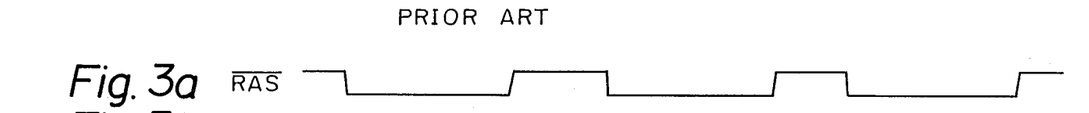
FIGS. 3a to 3d are timing charts showing the memory data read operation of the semiconductor memory device shown in FIG. 1.
Figure 3B:
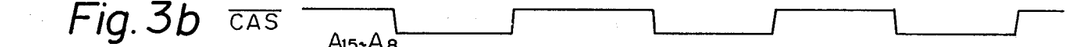
Figure 3C:
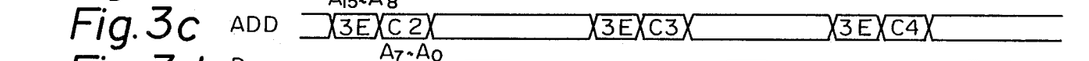
Figure 3D:
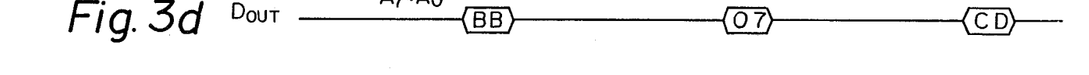

The above read operation will now be explained with reference to FIGS. 3a to 3d. The microprocessor 1 transmits an address signal ADD, consisting of a row-address "3E" stored in bits $A_{16}$ to $A_8$, and a column-address "C2" stored in bits $A_7$ to $A_0$, to the RAM 2 as shown in FIG. 3C. A D-RAM controller (not shown) provided in the RAM unit 2 transmits an inverted row-address strobe signal $\overline{RAS}$, which is part of the control signal shown in FIG. 1, to the RAM 2 as shown in FIG. 3a, in response to the control signal from the microprocessor 1. In response to a trailing edge of the $\overline{RAS}$ signal, the RAM 2 reads the above row-address "3E" stored therein. The D-RAM controller also transmits an inverted column address strobe signal $\overline{CAS}$, which is also a part of the control signal shown in FIG. 1, to the RAM 2 as shown in FIG. 3b. In response to a trailing edge of the $\overline{CAS}$ signal, the RAM 2 reads the above column address "C2" stored therein. In the RAM 2, an access operation is carried out in response to the input address signal "3EC2", and operand data "BB" stored in the address "3EC2" is output from the RAM 2 as an output data $D_{OUT}$, as shown in FIG. 3d. After completing the reading of the operand data, the D-RAM controller restores the $\overline{RAS}$ and $\overline{CAS}$ signals to a high level state.

The above operations can be continuously effected to read the operand data "07", stored in the address "3EC3", and the operand data "CD" stored in the address "3EC4", into the microprocessor 1.

The microprocessor 1 then combines the above read operand data and executes an instruction of the combined operand.

The above read operation can be applied to a data read and store operation for continuously reading and storing a plurality of consecutive data. As can be understood from the above description, the requirement of a continuous plurality of operation sets for continuous data access, on one hand, results in a simple circuit construction of the computer system, but on other hand, limits high speed access for continuous data access. In the computer system, continuous accessing of a plurality of data upon one access request is required rather than a single data access. Accordingly, the conventional computer system cannot provide a high speed data access.

Preferred embodiments of the present invention will now be described with reference to the accompanying drawings.

Figure 4:
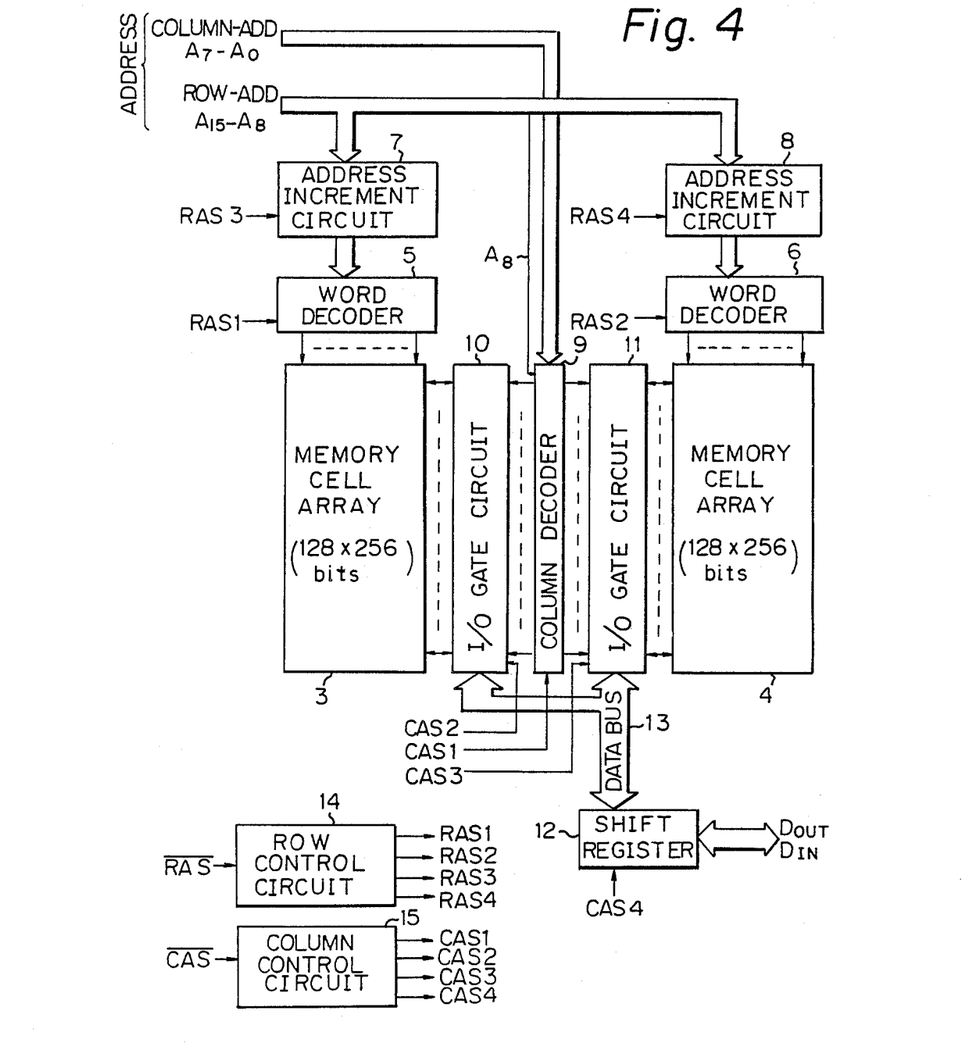
FIG. 4 is a circuit diagram of an embodiment of an address-multiplex type semiconductor memory device in accordance with the present invention.

FIG. 4 is a circuit diagram of an embodiment of an address-multiplex type semiconductor memory device in accordance with the present invention. In FIG. 4, the semiconductor memory device includes two divided memory cell arrays 3 and 4 each having a 128×256 bits capacity, word decoders 5 and 6 cooperating with the memory cell arrays 3 and 4, and address increment circuits 7 and 8 provided at input portions of the word decoders 5 and 6. The semiconductor memory device also includes a column decoder 9, an input and output (I/O) gate circuit 10 connected between the memory cell array 3 and the column decoder 9, an I/O gate circuit 11 connected between the memory cell array 4 and the column decoder 9, and a shift register 12 connected to the I/O gate circuits 10 and 11 through a data bus 13. The semiconductor memory device further includes a row control circuit 14 and a column control circuit 15.

In FIG. 4, the microprocessor and the D-RAM controller are omitted. However, the semiconductor memory device receives an address signal consisting of a row-address expressed by two hexadecimal digits by using bits $A_8$ to $A_{15}$, a column-address expressed by two hexadecimal digits by using bits $A_0$ to $A_7$, an inverted row-address-strobe signal $\overline{RAS}$, and an inverted column-address-strobe signal $\overline{CAS}$, from a D-RAM controller (not shown). The row-address is supplied to the address increment circuits 7 and 8, and the column-address is supplied to the column decoder 9. The $\overline{RAS}$ signal is intput to the row control circuit 14 to control a row address system and to generate a plurality of internal timing control signals RAS1 to RAS4 for controlling the word decoders 5 and 6 and the address increment circuits 7 and 8 respectively. The $\overline{CAS}$ signal is also input to the column control circuit 15 to control a column address system and to generate a plurality of internal timing control signals CAS1 to CAS4 for controlling the column decoder 9 and the I/O gate circuits 10 and 11. Simplify the description, the above RAS1 to RAS4 signals are referred to as the $\overline{RAS}$ signal, and the above CAS1 to CAS4 signals are referred to as the $\overline{CAS}$ signal.

The semiconductor memory device outputs data to the microprocessor through the shift register 12, when a read access request is received from the microprocessor. On the other hand, the semiconductor memory device inputs data at the shift register 12 from the D-RAM controller when the microprocessor 1 requests a data store.

In the embodiment, the memory cell array 3 stores data for even row addresses, and the memory cell array 4 stores data for odd row addresses. When the lowest bit $A_8$ of the row address is low, indicating an even row address, for example, when the row address is "3E", the row address "3E" is supplied to the word decoder 5 through the address increment circuit 7, whereby a word line for the memory cell array 3, designated by the row address, i.e., a word address "3E", may be selected. At the same time, the row address "3E" is supplied to the address increment circuit 8 and is added by one therein. The added row address "3E +1" is supplied to the word decoder 6. A word line for the memory cell array 4, designated by the word address "3E +1 =3F" may be selected. Conversely, when the lowest bit $A_8$ of the row address is high, indicating an odd row address, the above mentioned relation for word line selection is reversed.

The operation of the semiconductor memory device will now be described with reference to FIGS. 5a to 5d. In the following description, it is assumed that eight memory devices are used to form a memory unit as in FIG. 1, so that operand data as shown in FIG. 2 can be read out from the unit in accordance with the address as in FIG. 2, though only one memory device is illustrated in FIG. 4.

Figure 5A:
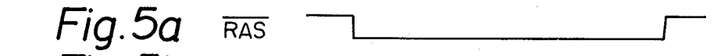
FIGS. 5a to 5d are timing charts showing the memory data read operation of the semiconductor memory device shown in FIG. 4.
Figures 5B, 5C:
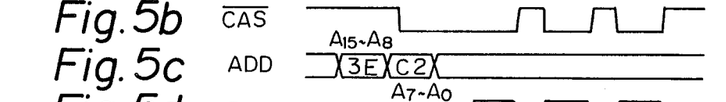
Figure 5D:
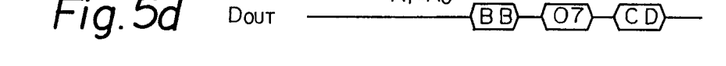

The microprocessor transmits an address signal consisting of a row-address "3E" and a column-address "C2" to the semiconductor memory device, as shown in FIG. 5c. The D-RAM controller transmits a $\overline{RAS}$ signal to the semiconductor memory device, as shown in FIG. 5a. In response to a trailing edge of the $\overline{RAS}$ signal, the row address "3E" is received at the address increment circuit 7 and is transmitted to the word decoder 5. Simultaneously, the row address "3E" is received at the address increment circuit 8 and a one is added thereto. The added row address "3E +1 =3F" is transmitted to the word decoder 6. The D-RAM controller also transmits a $\overline{CAS}$ signal to the semiconductor memory device, as shown in FIG. 5b. In response to the trailing edge of the $\overline{CAS}$ signal, the column address "C2" is received at the column decoder 9. In addition, the lowest bit $A_8$ of the row address is received at the column decoder 9.

A word line corresponding to the row address "3E" in the memory cell array 3 and a word line corresponding to the row address "3E +1 =3F" in the memory cell array 4 are selected. A bit line in the memory cell array 3, corresponding to the column address "C2" is selected by the column decoder 9 and is connected to one signal line of the data bus 13 by the I/O gate circuit 10. The I/O gate circuit 10 also connects a plurality of subsequent,, bit lines, e.g., 3 lines, to the above selected bit line and to a plurality of subsequent data lines, e.g., 3 lines, in the data bus 13. As a result, 4 bits of data stored in the address from "3EC2" to "3EC5" are read out in parallel and are stored in the shift register 12. The data obtained from the addressed column "C2" is output as one bit of the data "BB", while the $\overline{CAS}$ signal is maintained at a low level. Upon completion of this read operation for the data "BB", the D-RAM controller changes the $\overline{CAS}$ signal to a high level, as shown in FIG. 5b, whereby the one bit read out data of the data "BB" is reset and at the same time the data stored in the shift register 12 is serially shifted from the shift register 12 and input to the microprocessor as read-out data $D_{OUT}$.

In order to obtain the next column address data, the D-RAM controller changes the $\overline{CAS}$ signal to a low level state, as shown in FIG. 5b. Upon detecting the trailing edge of the $\overline{CAS}$ signal, the next column address data for "07" is output from the memory device. The succeeding two column data are similarly obtained by repetitively changing the $\overline{CAS}$ signal. The D-RAM controller then changes the $\overline{RAS}$ signal to a high level state to terminate the consecutive read operation.

Comparing the embodiment with the prior art system set forth above, the embodiment substantially reduces the access time for a consecutive read operation due to the elimination of transmission of the address data and the RAS signal for every read operation from the microprocessor 1 and the D-RAM controller to the semiconductor memory device.

By transmitting a first address signal and the $\overline{RAS}$ and $\overline{CAS}$ signals for a first read access request and only the $\overline{CAS}$ signal for the subsequent read access request, the microprccessor reads consecutive data until the $\overline{RAS}$ signal is changed to a high level state. The microprocessor 1, of course, reads only one set of data in the manner shown in prior art FIGS. 3a to 3d.

Obviously, the above feature of the embodiment can applied to a data store operation of the semiconductor memory device. In this case, the data to be stored is applied to the shift register 12 from the microprocessor serially as input data $D_{IN}$, and is stored in the corresponding address in the memory cell array 3 or 4 through the data bus 13 the I/O gate circuit 10 or 11, and the bit lines of the memory cell array 3 or 4. A more specific aspect of the above embodiment referred to in FIGS. 4 and 5a to 5d will now be described with reference to FIG. 6.

Figures 6, 6A:
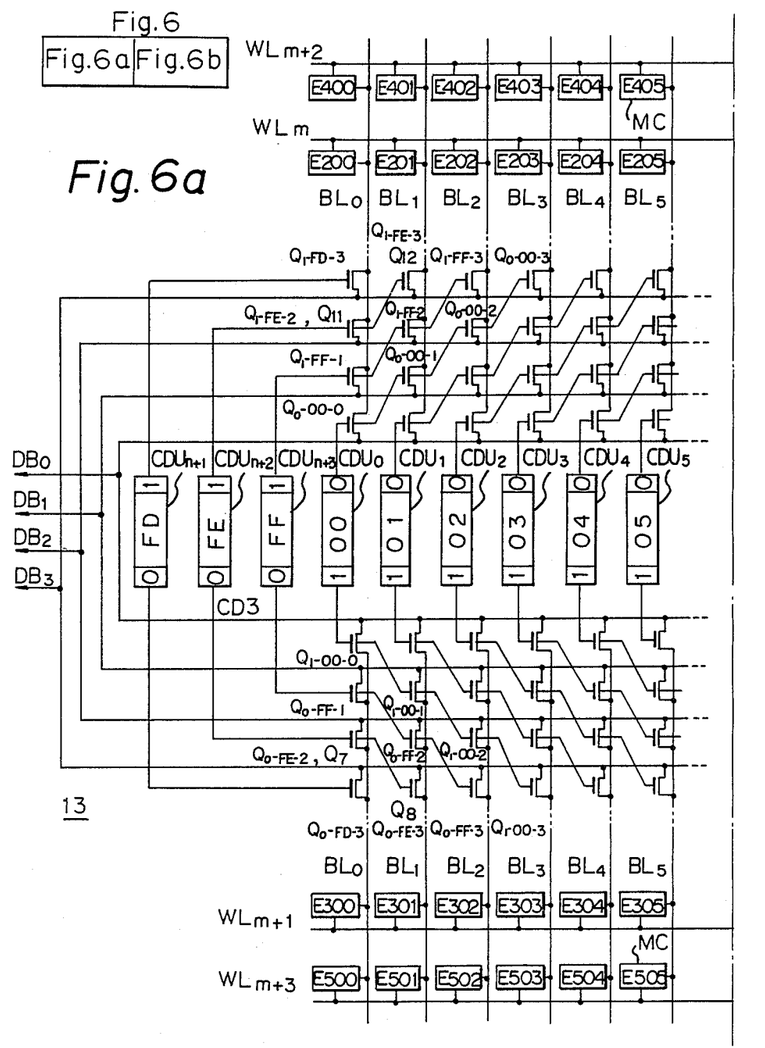
Figure 6B:
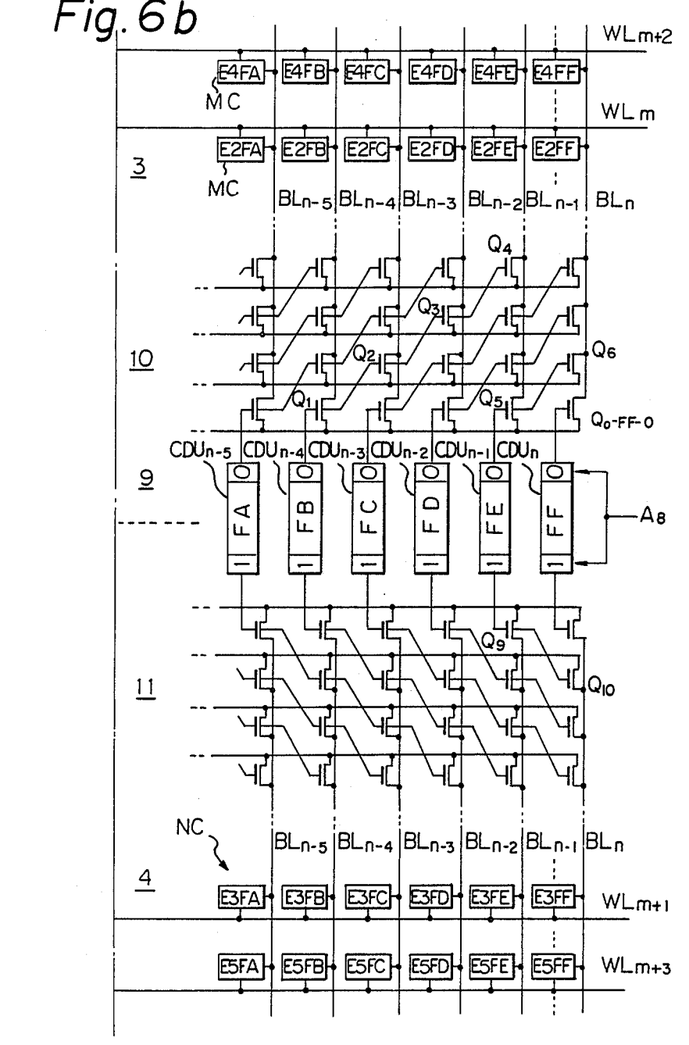

In FIG. 6, memory cell arrays 3 and 4, input and output (I/O) gate circuits 10 and 11, and a column decoder 9 correspond to those of FIG. 4. Other circuit elements shown in FIG. 4 are omitted here.

The memory cell array 3 includes a plurality of memory cells MC connected between a plurality of bit lines $BL_0, BL_1, \ldots, BL_n$ and a plurality of word lines $BL_0$, BL$_2$, ..., BL$_{m+22}$, ... (m is an even integer). The memory cell array 4 also includes a plurality of memory cells MC connected between a plurality of bit lines BL$_0$, BL$_1$, ..., BL$_n$ and a plurality of word lines BL$_1$, BL$_3$, BL$_{m+3}$, .... Each four digit-hexadecimal number in each memory cell represents an address thereto. The data bus 13 includes four parallel data lines DB$_0$, DB$_1$, DB$_2$ and DB$_3$. The I/O gate circuit 10 includes a plurality of transfer-gate transistors connected between the date lines DB$_0$ to DB$_3$ and the bit lines BL$_0$ to BL$_n$ of the memory cell array 3 and controlled by the column decoder 9. The I/O gate circuit 11 also includes a plurality of transfer-gate transistors connected between the data lines DB$_0$ to DB$_3$ and the bit lines BL$_0$ to BL$_n$ of the memory cell array 4 and controlled by the column decoder 9.

The column decoder 9 includes a plurality of column decoder units CDU$_0$ to CDU$_n$ provided corresponding columns, i.e., bit lines. In addition, the column decoder 9 includes three additional column decoder units CCU$_{n+1}$, CDU$_{n+2}$, and CDU$_{n+3}$. Each of the column decoder units CDU$_0$ to CDU$_N$ and CDU$_{n+1}$ to CDU$_{n+3}$ receives the A$_8$ bit of the address signal representing an odd or even row-address to select the corresponding transfer-gate transistors of the I/O gate circuit 10 or 11. However, the above selection of the additional column decoder units CDU$_{n+1}$ to CDU$_{n+9}$ by the A$_8$ bit of the address signal is the reverse of that of the column decoder units CDU$_0$ to CDU$_n$, as shown in FIG. 6. When the word address bit A$_8$ is "0" and the column address is "00", the column decoder unit CDU$_0$ turns ON the transfer-gate transistor Q$_{0\text{-}00\text{-}0}$ in the I/O gate circuit 10 connected between the bit line BL$_0$ of the memory cell array 3 and the data line DB$_0$, the transistor Q$_{0\text{-}00\text{-}1}$ between the bit line BL$_1$ and the data line DB$_1$, the transistor Q$_{0\text{-}00\text{-}2}$ between the bit line BL$_2$ and the data line DB$_2$, and the transistor Q$_{0\text{-}00\text{-}3}$ between the bit line BL$_3$ and the data line DB$_3$, simultaneously. On the other hand, when the word address bit A$_8$ is "1" and the column address is "00", the column decoder unit CDU$_0$ turns ON the transistors Q$_{1\text{-}00\text{-}0}$, Q$_{l\text{-}00\text{-}1}$, Q$_{l\text{-}00\text{-}2}$ and Q$_{l\text{-}00\text{-}3}$ in the I/O gate circuit 11. In this way, each of the column decoder units CDU$_0$ to CDU$_n$ connects four bit lines including the selected column, for example, column "00", connected to the memory cell array 3 or 4 corresponding to the word address bit A$_8$, to the corresponding data lines DB$_0$ to DB$_3$. The additional column decoder unit CDU$_{n+1}$ controls the transistor Q$_{l\text{-}FD\text{-}3}$ in the I/O gate circuit 10, connected between the bit line BL$_0$ of the memory cell array 3 and the data line DB$_3$, and the transistor Q$_{0\text{-}FD\text{-}3}$ in the I/O gate circuit 11, connected between the bit line BL$_0$ of the memory cell array 4 and the data line DB$_3$, by the word address bit A$_8$. The additional column decoder unit CDU$_{n+2}$ controls the transistors Q$_{l\text{-}FE\text{-}2}$, i.e., Q$_{11}$ and Q$_{l\text{-}FE\text{-}3}$, i.e., Q$_{12}$, in the I/O gate circuit 10 or the transistors Q$_{0\text{-}FE\text{-}2}$, i.e., Q$_7$ and Q$_{0\text{-}FE\text{-}3}$, i.e., Q$_8$, n the I/O gate circuit 11. The additional column decoder unit CDU$_{n+3}$ controls the transistors Q$_{l\text{-}FF\text{-}1}$, Q$_{l\text{-}FF\text{-}2}$, and Q$_{l\text{-}FF\text{-}3}$ in the I/O gate circuit 10 or the transistors Q$_{0\text{-}FF\text{-}1}$, Q$_{0\text{-}FF\text{-}2}$, and Q$_{0\text{-}FF\text{-}3}$ in the I/O gate circuit 11.

In FIG. 6, note that the column decoder units are in pairs i.e., CDU$_{n-2}$ and CDU$_{n+1}$ for the column address "FD", CDU$_{n-1}$ and CDU$_{n+2}$ for the column address "FE", and CDU$_n$ and CDU$_{n+3}$ for the column address "FF". Accordingly, when, for example, the column address is "FF", the column decoders CDU$_n$ and CDU$_{n+3}$ operate simultaneously. In addition, when, the word address bit A$_8$ is "0", the transfer-gate transistor Q$_{0\text{-}FF\text{-}0}$ in the I/O gate circuit 10 can be turned ON by the column decoder unit CDU$_n$ and three transfer-gate transistors Q$_{0\text{-}FF\text{-}1}$, Q$_{0\text{-}FF\text{-}2}$, and Q$_{0\text{-}FF\text{-}3}$ in the I/O gate circuit 11 can be turned ON by the column decoder unit CDU$_{n+3}$. As can be seen from the above, the additional column decoder units CDU$_{n+1}$ to CDU$_{n+3}$ are provided to take a continuation of column addresses from the memory cell array 3 to the memory cell array 4, and vice versa. In order to obtain the continuation of column addresses, a sequence of word lines is also defined alternatively between the memory cell arrays 3 and 4, i.e., as WL$_m$, WL$_{m+2}$ in the memory cell array 3 and WL$_{m+1}$, WL$_{m+3}$ in the memory cell array 4 in FIG. 6.

The operation of the circuit shown in FIG. 6 will now be described.

When the start address is "E2FB", that is the word address is "E2" and the column address "FB", and thus the address bit A$_8$ is also "0", the word line WL$_m$ (m ="E2") in the memory cell array 3 is selected in response to the trailing edge of the $\overline{RAS}$ signal. Also, the column decoder unit CDU$_{n-4}$ is selected in response to the trailing edge of the $\overline{CAS}$ signal. The transfergate transistors Q$_1$, Q$_2$, Q$_3$, and Q$_4$ in the I/O gate circuit 10 are turned ON by the column decoder unit CDU$_{n-4}$. The bit lines BL$_{n-4}$, BL$_{n-3}$, BL$_{n-2}$, and BL$_{n-1}$ to the memory cell array 3 are respectively connected to the data lines DB$_0$, DB$_1$, DB$_2$, and DB$_3$. As a result, data in four memory cells at the addresses "E2FB", "E2FC", "E2FD", and "E2FE" are read the memory cell array 3 and are stored in parallel in the shift register 12, shown in FIG. 4. The stored data is serially output to the microprocessor in response to the change of the $\overline{CAS}$ signal. Consequently, four consecutive pieces of data stored in the above consecutive addresses are read in the microprocessor.

When the start address is "E2FE", i.e., the word address is "E2" and the column address is "FE", and accordingly, the address bit A$_8$ is "0", the word line WL$_m$ (m ="E2") in the memory cell array 3 is selected in response to the trailing edge of the $\overline{RAS}$ signal. The column decoder unit CDU$_{n-1}$ is selected in response to the trailing edge of the $\overline{CAS}$ signal. At the same time, the additional column decoder unit CDU$_{n+2}$ is also selected. The transfer-gate transistors Q$_5$ and Q$_6$ in the I/O gate circuit 10 are then turned ON by the column decoder unit CDU$_{n-1}$. In addition, the transfer-gate transistors Q$_7$, i.e., Q$_{0-FE-2}$, and Q$_8$, i.e., Q$_{0-FE-3}$, in the I/O gate circuit 11 are turned ON by the column decoder unit CDU$_{n+2}$, and the bit lines BL$_{n-1}$ and BL$_n$ in the memory cell array 3 are respectively connected to the data lines DB$_0$ and DB$_1$. As a result, data stored in the addresses "E2FE" and "E2FF" in the memory cell array 3 is read to the shift register 12 through the data lines DB$_0$ and DB$_1$. Simultaneously, data stored in the addresses "E300" and "E301" in the memory cell array 4 is read to the shift register 12 through the data lines DB$_2$ and DB$_3$. Consequently, four consecutive pieces of data stored in the addresses "E2FE" and "E2FF" in the memory cell array 3 and "E300" and E301" in the memory cell array 4 are serially read into the microprocessor, in response to the change of the $\overline{CAS}$ signal.

When the start address is "E3FE", i.e., the word address is "E3" and the column address is "FE", and accordingly, the address bit A$_8$ is "1", the word line WL$_{m+1}$ (m+1 ="E3") in the memory cell array 4 is selected in response to the trailing edge of the $\overline{RAS}$ 1 signal. The column decoder units CDU$_{n-1}$ and $CDU_{n+2}$ are selected in response to the trailing edge of the $\overline{CAS}$ signal. The transfer-gate transistors $Q_9$ and $Q_{10}$ in the I/O gate circuit 11 are turned ON by the column decoder unit $CDU_{n-1}$, and the transistors $Q_{11}$, i.e., $Q_{1-FE-2}$, and $Q_{12}$, i.e., $Q_{1-FE-3}$, are also turned ON by the additional column decoder unit $CDU_{n+2}$. The bit lines $BL_{n+1}$ and $BL_n$ in the memory cell array 4 are connected to the data lines $DB_0$ and $DB_1$, and the bit lines $BL_0$ and $BL_1$ in the memory cell array 3 are connected to the data lines $DB_2$ and $DB_3$. As a result, data stored in the addresses "E3FE" and "E3FF" in the memory cell array 4 is stored in the shift register 12 through the data lines $DB_0$ and $DB_1$. Simultaneously, data stored in the addresses "E400" and "E401" is stored in the shift register 12 through the data lines $DB_2$ and $DB_3$. Consequently, four consecutive pieces of data stored in the addresses "E3FE" and "E3FF" in the memory cell array 4 and "E400" and "E401" in the memory cell array 3 are serially read in the microprocessor in response to the change of the $\overline{CAS}$ signal.

In the above embodiment, shown in FIG. 6, the address increment circuits 7 and 8 in FIG. 4 are not shown. However, the function of the address increment circuits 7 and 8 set forth above with reference to FIG. 4 is achieved by construction of the word lines WL in the memory cell arrays 3 and 4. Selection of the bit lines BL of the memory cell arrays 3 and 4 is performed using the transfer-gate transistors in the I/O gate circuits 10 and 11, which are turned ON by the column decoder units $CDU_0$ to $CDU_n$ and $CDU_{n+1}$ to $CDU_{n+3}$.

In FIG. 6, four bit lines $DB_0$ to $DB_3$ are shown and the shift register 12 has a capacity for storing four pieces of data. Thus, four consecutive read or write operations may be performed. The number of additional column decoder units is defined as "the number of data lines minus one".

Figure 7:
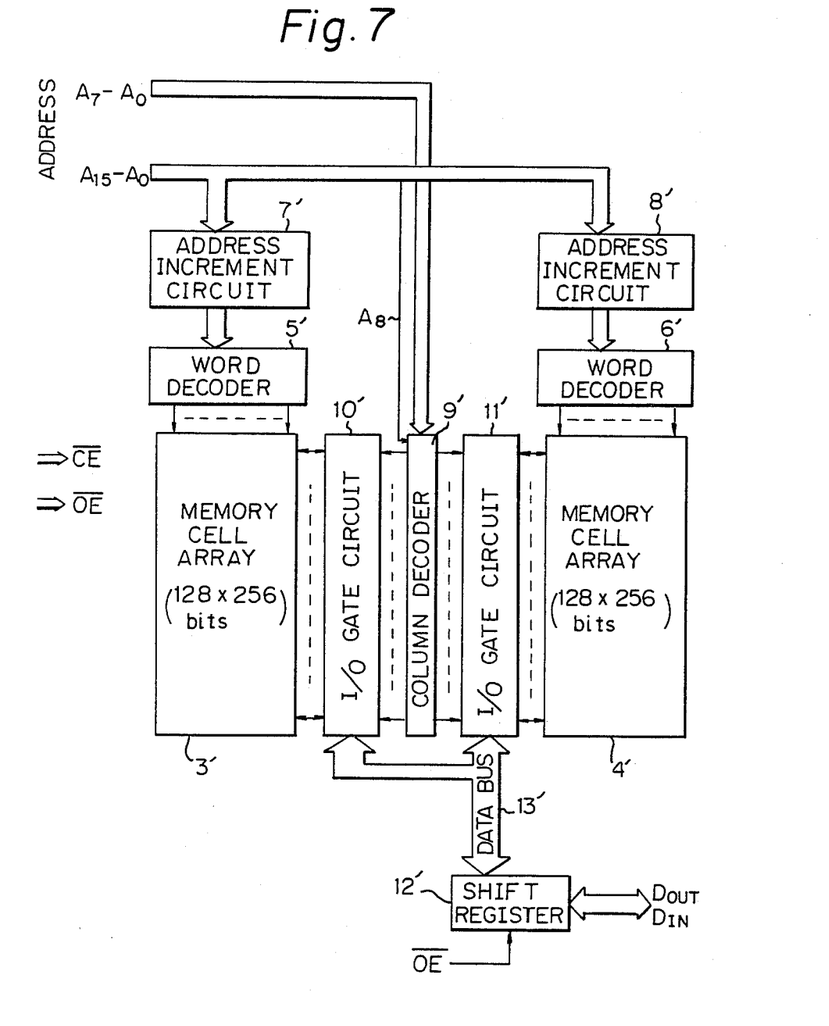
FIG. 7 is a circuit diagram of another embodiment of a non-address-multiplex type semiconductor memory device in accordance with the present invention.
Figure 8A:
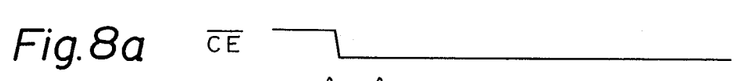
FIGS. 8a to 8d are timing charts showing the memory data read operation of the semiconductor memory device shown in FIG. 7.
Figure 8B:
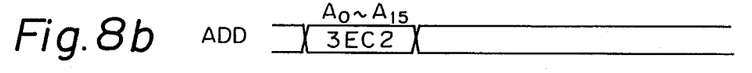
Figure 8C:
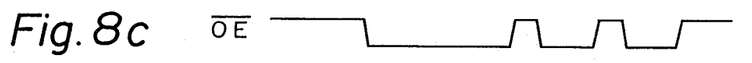
Figure 8D:
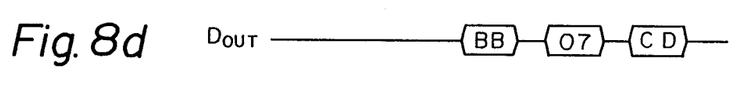

FIG. 7 is a circuit diagram of another embodiment of a non-address multiplex type semiconductor memory device in accordance with the present invention.

The semiconductor memory device shown in FIG. 7 has a similar construction to that shown in FIG. 4. The semiconductor memory device includes two divided memory cell arrays 3' and 4', word decoders 5' and 6', address increment circuits 7' and 8', a column decoder 9', input and output gate circuits 10' and 11', a shift register 12, and a data bus 13'.

The operation of the semiconductor memory device shown in FIG. 7 will now be described with reference to FIGS. 8a to 8d.

The microprocessor transmits an address signal "3EC2" to the semiconductor memory device. The D-RAM controller changes an inverted chip enable signal $\overline{CE}$ to low level. In response to a trailing edge of the $\overline{CE}$ signal, the semiconductor memory device receives the address signal "3EC2" and starts the memory access operation. The D-RAM controller changes the state of an inverted output enable signal $\overline{OE}$ to low level. As a result, output data "BB" in the address "3EC2" is output as output data $D_{OUT}$ from the shift register 12'. The $\overline{OE}$ signal is a signal controlling the data output operation. When the $\overline{OE}$ signal is low level, the read data $D_{OUT}$ from the memory cell array 3' and 4' is output. By changing the level of the $\overline{OE}$ signal between low and high, subsequent data "07" and "CD" is read into the microprocessor.

The circuit shown in FIG. 6 may be applied to the semiconductor memory device shown in FIG. 7.

Many widely different embodiments of the present invention may be constructed without departing from the spirit and scope of the present invention. It should be understood that the present invention is not limited to the specific embodiments described in this specification, except as defined in the appended claims.

I claim:

1. A semiconductor memory device operatively connected to receive first and second control signals, comprising:

memory means including first and second memory cell blocks each of which includes a plurality of memory cell, said memory cells in each of said first and second memory cell blocks being arranged in a matrix having rows and columns;

first and second row selection means, operatively connected to said first and second memory cell blocks, respectively, and connected to receive a row address, for selecting one of said rows in said first and second memory cell blocks corresponding to the row address, and for selecting one of said rows alternately from one of said first and second memory cell blocks when the row address is incremented, said first and second row selection means including:

means for simultaneously selecting a next one of said rows corresponding to a next row address from one of said first and second memory cell blocks while one of said rows corresponding to the received row address is selected from the other one of said first and second memory cell blocks;

a plurality of data bus means, connected to said memory means, for inputting or outputting data to or from said memory means;

a plurality of first and second sets of data transfer means, connected to said data bus means and to said columns of said first and second memory cell blocks, respectively, for transferring data between said data bus means and selected columns; and a plurality of column selection units, respectively, operatively connected to said first and second sets of said data transfer means, and connected to receive a column address, for designating one of said columns corresponding to the column address from one of said first and second memory cell blocks including said selection row, and selecting a predetermined number of said columns including said designated column by selecting one of said sets of said data transfer means, said selected one of said sets of data transfer means transferring data between said selected predetermined number of said columns and said data bus means, said designated column being coupled to a predetermined one of said data bus means, the remaining selected predetermined number of said columns corresponding to contiguous column addresses consecutive to the received column address, the contiguous column addresses being such that the last column address is followed by the initial column address to maintain contiguity, said column selection units selecting an initial column corresponding to the initial column address from the other one of said first and second memory cell blocks in which said next one of said rows corresponding to the next row address is included when said selected predetermined number of said columns include said initial column to maintain contiguity of the column addresses thereof.

2. A semiconductor memory device according to claim 1, wherein said first and second row selection means include:
   word decoders connected to said respective first and second memory cell blocks; and
   address increment circuits connected to receive row address signals and connected to said word decoders.

3. A semiconductor memory device according to claim 1, wherein said column selection units include:
   column decoder units connected to receive column address signals and a row address signal; and
   column selector means, connected to said column decoder units, for selecting a column decoder in accordance with the row address signal.

4. A semiconductor memory device according to claim 3, wherein said column selector means is located on either side of said column decoder units.

5. A semiconductor memory device according to claim 3, wherein said column selector means is a column transfer gate driver located on either side of said column decoder units.

6. A semiconductor memory device comprising:
   memory means including first and second memory cell blocks each of which includes a plurality of memory cells, said memory cells in each of said first and second memory cell blocks being arranged in a matrix having rows and columns;
   first and second row selection means, operatively connected to said first and second memory cell blocks, respectively, and connected to receive a row address, each of said first and second row selection means selecting one of said rows in each of said first and second memory cell blocks in dependence upon the received row address;
   a plurality of data bus means, coupled to said memory means, for inputting and outputting data in parallel to or from said memory means; and
   a plurality of sets of column selection means, coupled to said data bus means, for selecting a predetermined number of said columns having consecutive column addresses and coupling the selected columns to said data bus means for enabling data transfer therebetween, said column selection means selecting all of said selected columns from one of said first and second memory cell blocks when said consecutive column addresses are intermediate between initial and final column addresses, and selecting a part of said selected columns from one of said first and second memory cell blocks and the remaining columns from the remaining said first and second memory cell blocks when said consecutive column addresses are transitional from the final to the initial column addresses.

7. A semiconductor memory device according to claim 6, wherein said first and second row selection means include:
   word decoders connected to said respective first and second memory cell blocks; and
   address increment circuits connected to receive row address signals and connected to said word decoders.

8. A semiconductors memory device according to claim 6, wherein said column selection means include:
   column decoder units connected to receive column address signals and a row address signal; and
   column selector means, connected to said column decoder units for selecting a column decoder in accordance with the row address signal.

9. A semiconductor memory device according to claim 8, wherein said column selector means is located on either side of said column decoders.

10. A semiconductor memory device according to claim 8, wherein said column selector means is a column transfer gate driver located on either side of said column decoder units.

* * * * *

UNITED STATES PATENT AND TRADEMARK OFFICE
CERTIFICATE OF CORRECTION

PATENT NO. : 4,773,049

DATED : SEPTEMBER 20, 1988

INVENTOR(S) : YOSHIHIRO TAKEMAE

It is certified that error appears in the above-identified patent and that said Letters Patent is hereby corrected as shown below:

Title page:

FRONT PAGE [57] ABSTRACT, line 7, "from" should be --into--;
        line 7, "in" should be --from--;
        line 10, "reading/s-" should be --reading/- --;
        line 11, "toring" should be --storing--;
        line 11, "from" should be --into--;
        line 12, "in" should be --from--.

Col. 1, line 50, "a for receiving" should be --for receiving a--;
        line 51, "from" should be --into--;
        line 52, "in. The" should be --in the--;
        line 68, "circuits," should be --circuits--.

Col. 2, line 37, after "circuit" insert --is--.

Col. 3, line 1, delete "being";
        line 4, delete "data into";
        line 4, after "from" insert --or into--;
        line 6, after "reading" insert --data into--;
        line 6, delete "or into".

Col. 6, line 13, "subsequent,," should be --subsequent--;
        line 51, after "can" insert --be--.

UNITED STATES PATENT AND TRADEMARK OFFICE
CERTIFICATE OF CORRECTION

PATENT NO. : 4,773,049
DATED : SEPTEMBER 20, 1988
INVENTOR(S) : YOSHIHIRO TAKEMAE

It is certified that error appears in the above-identified patent and that said Letters Patent is hereby corrected as shown below:

Col. 7, line 1, "$BL_{m+22}$, ..." should be --$BL_m$, $BL_{m+2}$, ... --;

line 4, "$Bl_n$" should be --$BL_n$--;

line 4, after "$BL_3$," insert -- ..., $BL_{m+1}$, --;

line 17, after "provided" insert --for--;

line 20, "$CCU_{n+1}$," should be --$CDU_{n+1}$,--;

line 56, "n" should be --in--;

line 60, "$_1$," should be --$Q_{0-FF-1}$,--.

Col. 8, line 22, "transfergate" should be --transfer-gate--;
line 29, after "read" insert --from--;
line 45, "0N" should be --ON--.

Col. 9, line 5, "0N" should be --ON--.

UNITED STATES PATENT AND TRADEMARK OFFICE
CERTIFICATE OF CORRECTION

PATENT NO. : 4,773,049

DATED : SEPTEMBER 20, 1988

INVENTOR(S) : YOSHIHIRO TAKEMAE

It is certified that error appears in the above-identified patent and that said Letters Patent is hereby corrected as shown below:

Col. 10, line 13, "cell," should be --cells,--;
        line 47, "selection" should be --selected--.

Col. 12, line 25, "semiconductors" should be --semiconductor--.

Signed and Sealed this

Twenty-first Day of February, 1989

Attest:

DONALD J. QUIGG

*Attesting Officer*       *Commissioner of Patents and Trademarks*